United States Patent [19]
Reid

[11] Patent Number: 6,024,857
[45] Date of Patent: Feb. 15, 2000

[54] ELECTROPLATING ADDITIVE FOR FILLING SUB-MICRON FEATURES

[75] Inventor: Jonathan David Reid, Sherwood, Oreg.

[73] Assignee: Novellus Systems, Inc., San Jose, Calif.

[21] Appl. No.: 08/947,222

[22] Filed: Oct. 8, 1997

[51] Int. Cl.[7] ................................................. C25D 7/12
[52] U.S. Cl. ........................ 205/123; 205/125; 205/296
[58] Field of Search ................................. 205/296, 123, 205/125, 118

[56] References Cited

U.S. PATENT DOCUMENTS

| | | | |
|---|---|---|---|
| 3,725,220 | 4/1973 | Kessler et al. | 204/52 R |
| 3,767,539 | 10/1973 | Clauss et al. | 204/52 R |
| 3,769,179 | 10/1973 | Durose et al. | 204/24 |
| 4,134,803 | 1/1979 | Eckles et al. | 204/52 R |
| 4,181,582 | 1/1980 | Dahms | 204/52 R |
| 4,242,181 | 12/1980 | Malak | 204/52 R |
| 4,272,335 | 6/1981 | Combs | 204/52 R |
| 4,430,173 | 2/1984 | Boudot et al. | 204/52 R |
| 5,051,154 | 9/1991 | Bernards et al. | 205/125 |

FOREIGN PATENT DOCUMENTS 997951  7/1965  European Pat. Off. .

Primary Examiner—Kishor Mayekar
Attorney, Agent, or Firm—Skjerven, Morrill, MacPherson, Franklin & Friel LLP; David E. Steuber

[57] ABSTRACT

An electroplating system includes a standard electroplating apparatus using an acid copper bath with an additive for leveling. The additive is chosen to have molecules of a size that is about the size of the features to be filled by the electroplating process. The relatively large size of these additive molecules tends to hinder the mass transfer of the additive molecules into the features. Consequently, the additive molecules are preferentially absorbed by the surface of the plating surface relative to the inner surfaces of the features. Accordingly, the electroplating process tends to fill the features relatively quickly compared to the other parts of the target surface so that all of the surface area of the target is equivalent in height. Because little or no additive molecules are within the features, the features tend to be filled without the voids often produced using conventional systems.

15 Claims, 3 Drawing Sheets

ELECTROPLATING ADDITIVE FOR FILLING SUB-MICRON FEATURES

FIELD OF THE INVENTION

The present invention relates to electroplating and more particularly, to electroplating additives. Still more particularly, the present invention relates to electroplating additives for use in electroplating integrated circuit wafers having sub-micron features.

BACKGROUND

Some conventional copper electroplating processes use additives in the electroplating bath to achieve electrodeposition of the copper with a smooth or level top surface. For example, these conventional processes may be used in printed circuit board fabrication to achieve copper deposits of uniform thickness across the surface of the circuit board, to level or increase the smoothness of the copper deposit, and to increase the rate at which copper deposits inside hole and vias in the circuit board (relative to the surface). Use of these additives allows consistent electrical and mechanical properties of the copper to be achieved across the circuit board's surface.

These conventional processes typically perform the copper electrodeposition from acid sulfate solutions with certain organic additives. For example, additives such as Selrex CuBath M® and Learonal Copper Gleam are commonly used. These organic additives help achieve the level top surface by increasing the deposition rate of the copper at the lower points of the deposition surface relative to the upper points on the deposition surface. It is believed that the mechanism for this leveling effect is that (a) the organic additives tend to absorb on to the plating surface, thus inhibiting the deposition of copper at the point of absorption, and (b) the mass transfer rate of the organic additives tend to be greater for higher points on the plating surface compared to the lower points on the plating surface. Consequently, the deposition rate at the lower points on the plating surface tends to be greater than the deposition rate at the higher points on the surface. This difference in deposition rate helps to achieve deposition with a level top surface.

However, the inventors have observed that these conventional organic additives are only marginally effective when the plating surface contains very small features (i.e., sub-micron) with high aspect ratios. In particular, the copper fill in a small feature tends to have voids, as shown in FIG. 1. These voids may increase the resistance of (or even open circuit) the conductive path intended to be formed by the copper deposited in the feature. This problem becomes critical in applying copper electrodeposition processes in integrated circuit fabrication. For example, contact and via holes in an integrated circuit can be a quarter micron or less in width, with an aspect ratio of up to four-to-one or greater. In particular, voids in the contacts and vias may result in high resistance interconnects or even open-circuits.

Accordingly, there is a need for an electroplating system capable of filling, without voids, sub-micron high aspect ratio features in a plating surface.

SUMMARY

In accordance with the present invention, an electroplating system is provided that is capable of filling sub-micron features having a high aspect ratio. In one embodiment adapted for copper electrodeposition upon a plating surface, the electroplating system includes a standard electroplating apparatus using an acid copper bath with an additive providing for preferential filling of submicron features. In accordance with the present invention, the additive is chosen to have molecules of a size that is about the size (or larger) of the features to be filled by the electroplating process. The term feature is used herein to refer to holes, vias, openings and other indentations formed in the plating surface.

Because the relatively large size of these additive molecules tends to hinder the mass transfer of the additive molecules into the features, the additive molecules are preferentially absorbed by the surface of the plating surface relative to the inner surfaces of the features. As a result of this preferential absorption of the additive molecules, the rate of plating in the features tends to be greater than the plating rate at the other parts of the plating surface. Accordingly, the electroplating process tends to fill the features relatively quickly compared to the other parts of the target surface so that all of the surface area of the target is equivalent in height, thereby leveling the plating surface.

In addition, because little or no additive molecules are within the features, the features tend to be filled without the voids often produced using conventional systems. These conventional systems use additives with relatively small-sized molecules that can enter the features. It is believed that the relatively small molecules of these conventional systems slow down the plating rate in the features enough so that the features cannot be completely filled before the plating at the upper "corners" of the feature close off the feature, creating a void. In contrast, because substantially no additive molecules can enter the features in this embodiment of the present invention, the plating rate in the features is great enough so that the features can be completely filled before the plating of the corners can close off the features, thereby avoiding the formation of voids.

DETAILED DESCRIPTION

Figure 1:
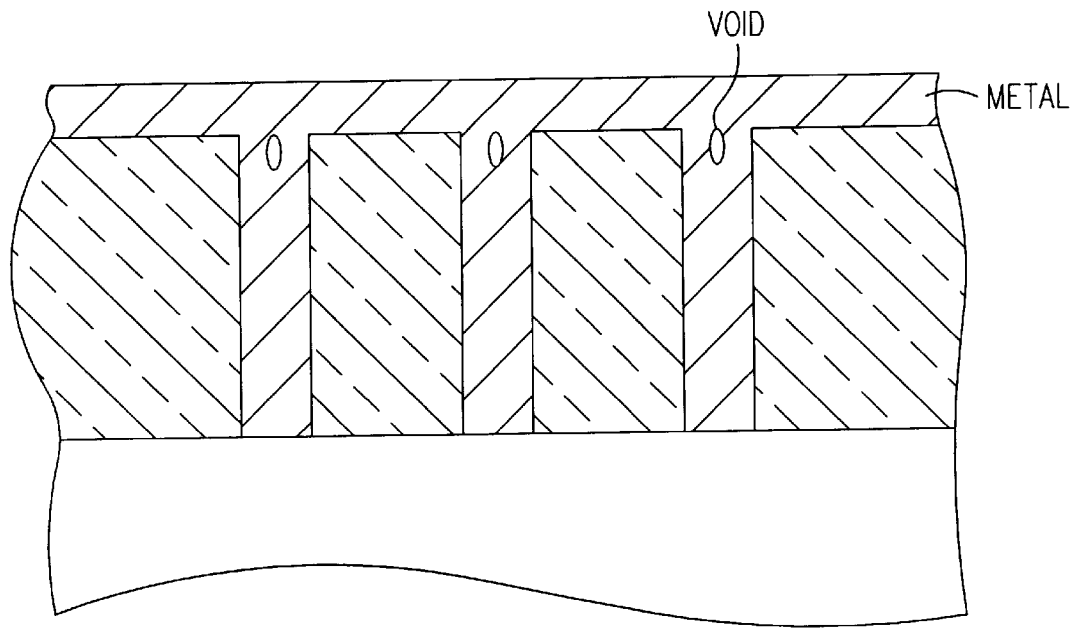
FIG. 1 is a cross-sectional diagram illustrative of voids formed in high aspect ratio features by a conventional electroplating system.
Figure 2:
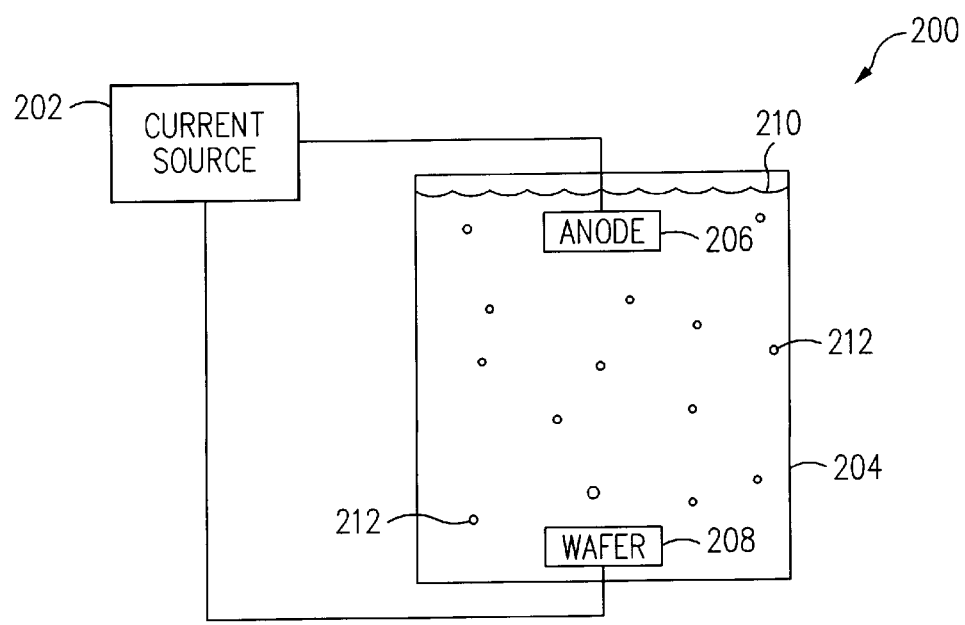
FIG. 2 is a functional block diagram of an electroplating system according to one embodiment of the present invention.

FIG. 2 is a functional block diagram of an electroplating system 200 for electroplating copper onto a semiconductor wafer, according to one embodiment of the present invention. The electroplating system 200 includes a standard electroplating cell with an adjustable current source 202, a bath container 204, an anode 206 and a cathode 208. In this embodiment, the cathode 208 is the semiconductor wafer that is to be electroplated with copper. The wafer 208, in this embodiment, has features (e.g., contact holes or via holes) with widths of about a quarter micron and having an aspect ratio of about four-to-one. Current integrated circuit technologies used for fabricating for high performance circuits generally define features having dimensions on the sub-micron level (e.g., a quarter micron or less). These integrated circuits can have inter-layer and inter-metal dielectric layers with a thickness of a micron or more (especially where planarization techniques are used to facilitate alignment of photolithographic processes), causing these features to have aspect ratios of four-to-one or greater.

In addition, this embodiment of the electroplating system 200 includes a bath 210 of acid copper sulfate solution with an additive 212 for providing for filling of sub-micron features and leveling the surface of the copper electrodeposited on the wafer 208. In accordance with the present invention, the additive 212 includes molecules of a size on the same order as the size of the features on the wafer 208 so as to facilitate filling of sub-micron features in the wafer 208 without voids, as described below in conjunction with FIG. 3.

In this embodiment of the electroplating system 200, the current source 202, the bath container 204 and the anode 206 are implemented using an electroplating cell such as, for example, a model LT210, available from Semitool, Kalispell, Mont. The electroplating cell should include an agitator to ensure proper distribution of the additive 212 in the bath 210. Although the additive 212 is used with a Model LT210 electroplating cell in this embodiment, the additive 212 can be used with any suitable commercially available or custom electroplating cell.

In this embodiment, the bath container 204 is used to hold a volume of about eight liters of an acid copper sulfate solution of copper sulfate ($CuSO_4$) at a concentration of about eighty grams per liter and sulfuric acid ($H_2SO_4$) at a concentration of about one hundred seventy grams per liter. The solution also contains chloride ions at a concentration of about seventy milligrams per liter. The chloride ion concentration typically ranges from about thirty to one hundred milligrams per liter. The current source 202 can induce a current in the range of about four to six amps from the anode 206 to wafer or cathode 208 in the bath 210.

Figure 3:
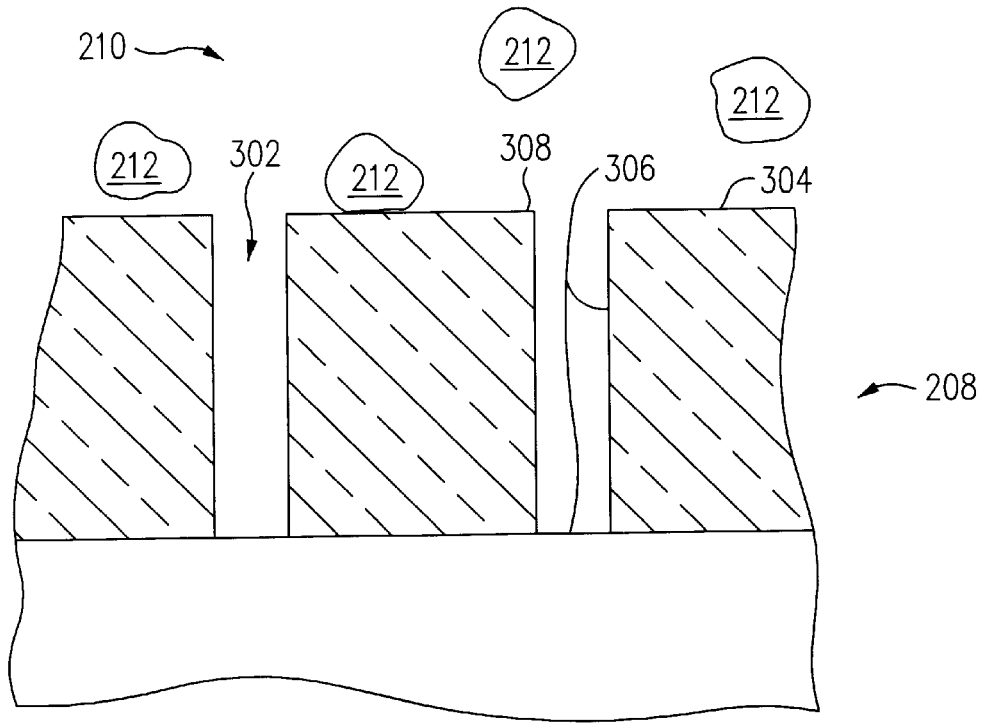
FIG. 3 is a cross-sectional diagram illustrative of the distribution of additive molecules in an electroplating system according to one embodiment of the present invention.

FIG. 3 is a cross-sectional diagram illustrative of the distribution of molecules of the additive 212 near the wafer 208 in the bath 210, according to one embodiment of the present invention. For clarity, FIG. 3 shows only a portion of the wafer 208 submerged in the bath 210. The wafer 208 includes features 302 in the surface of the wafer 208. In this embodiment, the features 302 are holes for contacts or vias with a width ranging from about two tenths to a quarter micron and a depth of about eight tenths to one micron. Accordingly, the features 302 have an aspect ratio of about four-to-one.

As illustrated in FIG. 3, the molecules of the additive 212 are sized so as to be on the order of than the width of the features or holes 302. Table 1 below lists a number of suitable additives and their corresponding molecular weights. Of course, other additives can be used that are suitably large compared to the size of the feature to be filled in the electroplating process. It is believed that for a feature size of about two tenths to a quarter micron, additive molecules having a molecular weight of about 200,000 to 10,000,000 in concentrations of about one part per million to about one part per thousand are suitable. However, the molecules should not be so large as to block the openings of the features, which could prevent electrodeposition in the features. The molecules listed in Table 1 tend to be relatively large organic molecules and, more particularly, polymers. Preferably, the additives are water soluble and acid stable (i.e., do not decompose quickly in the acid used in the bath). In addition, the additive must be of a sufficient concentration so as to be absorbed at the plating surface at a rate greater than the plating surface is being renewed. For the example additives listed in Table 1, concentrations of about one part per million to about hundred parts per million are believed to be suitable.

Although the example additives listed in Table 1 include the molecular weight of the additive (i.e., larger molecular weights generally indicating larger sizes of the molecules of the additive), additives with smaller molecular weights can be used provided the size and/or shape of the additive molecules is such that the additive is hindered in entering the features to be filled.

TABLE 1

| molecule | molecular weight |
| --- | --- |
| polyacrylic acid | 15,000 to 1,100,000 |
| polystyrene | 20,000 to 8,000,000 |
| polyvinyl alcohol | ≧200,000 |
| polyvinylpyrrolidone | 29,000 to 360,000 |
| poly(methyl methacrylate) | ≧300,000 |
| poly(ethylene oxide) | 100,000 to 8,000,000 |
| poly(dimethylsiloxane) and derivatives | 70,000 to 1,100,000 |
| polyacrylamide-co-acrylic acid | 200,000 to 5,000,000 |
| poly(2-hydroxyethl methacrylate) | ≦300,000 |
| poly(methyl vinyl ether-alt-maleic anhydride | 120,000 to 1,200,000 |
| poly(sodium 4-styrenesulfonate) and maleic acid copolymers | 120,000 to 1,000,000 |

Because of the relatively large size of these molecules, mass transfer of the additive 212 into the holes 302 is significantly reduced. Consequently, the molecules of the additive 212 are preferentially absorbed by the upper surface 304 of the wafer 204, in comparison to the inner surfaces 306 of the holes 302.

As a result of the preferential absorption of the molecules of the additive 212 on the surface 304, electroplating of the surface 304 is hindered whereas electroplating of the inner surfaces 306 of the holes 302 is relatively unaffected. Thus, plating rate in the holes 302 tends to be greater than the plating rate at the surface 304. Accordingly, the electroplating process tends to fill the holes 302 relatively quickly compared to the plating of the surface 304, whereby the entire surface of the wafer 204 is equivalent in height (i.e., reduced in topography or "leveled").

Figure 4:
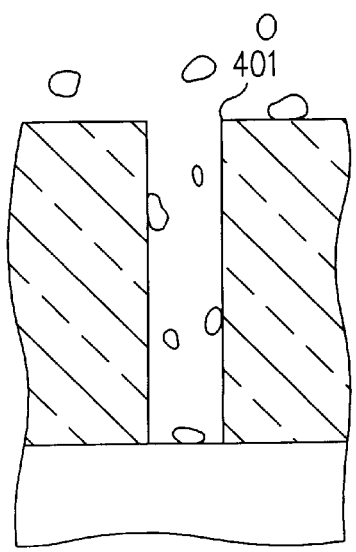
FIG. 4 is a cross-sectional diagram illustrative of the distribution of additive molecules in a conventional electroplating system.
Figure 5:
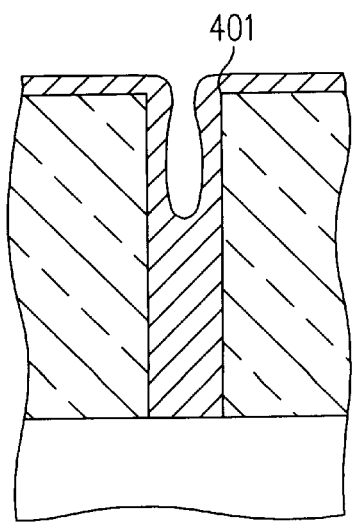
FIG. 5 is a cross-sectional diagram illustrative of the formation of voids in a conventional electroplating system.

In addition, because little or no additive molecules are within the holes 302, the holes 302 tend to be filled without the voids often produced using conventional systems. These conventional systems typically use additives with molecules small enough to easily enter the holes 302, as shown in FIG. 4. With reference to FIGS. 4 and 5, the applicant believes that the relatively small molecules of these conventional systems slow down the plating rate in the holes 302 (i.e., sub-micron high aspect ratio features) so that the plating at the upper corners 401 of the holes 302 close off the top of the holes before the holes are completely filled, creating voids 310 in the contact (or via).

Figure 6:
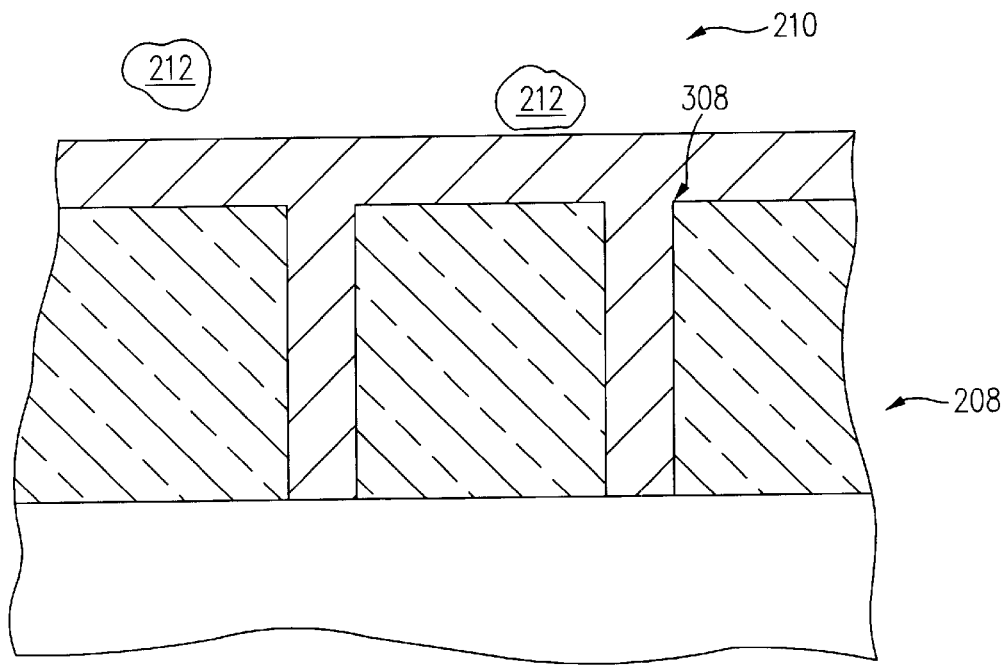
FIG. 6 is a cross-sectional diagram illustrative of the filling of sub-micron-high aspect ratio holes, in accordance with one embodiment of the present invention.

In contrast, as shown in FIG. 6, because in the electroplating system 200 (FIG. 2) substantially no molecules of the additive 212 can enter the holes 302 FIG. 3), the plating rate in the holes 302 is great enough so that the holes 302 can be completely filled before the plating of the corners 308 can close off the top of the holes 302. Accordingly, the electroplating system 200 (FIG. 2) advantageously fills the holes 302 without the formation of voids. The electroplating system 200 can be advantageously used to fill features on a plating surface, which features have a width ranging from about five hundredths of a micron to a half micron and an aspect ratio ranging from about one-to-one to about six-to-one.

Figure 7:
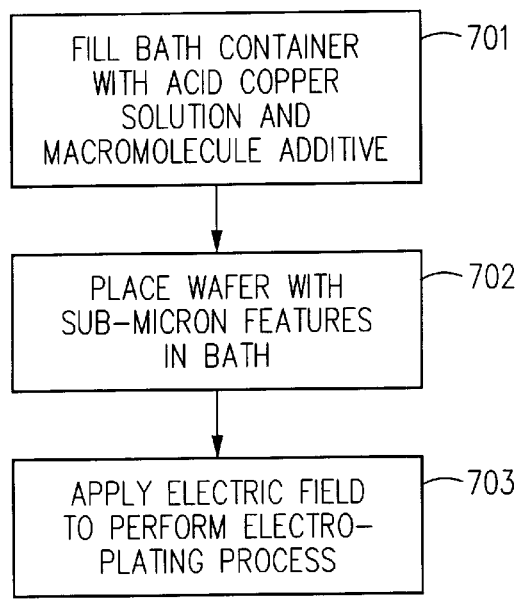
FIG. 7 is a flow diagram illustrative of an electroplating process according to one embodiment of the present invention.

FIG. 7 is a flow diagram illustrative of an electroplating process according to one embodiment of the present invention. In an initial step 701, the bath container of a conventional electroplating cell is filled with an acid copper sulfate solution. In addition, an additive having relatively large-sized molecules is added to the solution in the bath container. More particularly, the additive is chosen so that the molecules of the additive have a size greater than the width of the features in the wafer (described in the next step below). In this embodiment, fifteen parts per million (ppm) of poly(sodium 4-styrenesulfonate) (i.e., an additive from Table 1 above) in used in a solution of seventy-two grams per litter copper sulfate, one hundred seventy-five grams per liter sulfuric acid.

In a next step 702, a semiconductor integrated circuit wafer is placed in the solution contained in the bath container of the conventional electroplating cell. The wafer has sub-micron features with an aspect ratio of about four-to-one. In particular these features are holes used for contacts or vias and are about a quarter micron in width and about a micron in depth.

In a next step 703, at room temperature, a potential is applied across a copper anode of the electroplating cell and the wafer. This potential causes an electric field to arise around the anode and the wafer, which affects the distribution of the copper ions in the bath. In this embodiment, a potential of about two volts is applied for about two minutes, with a current of about four and a half amps flowing between the anode and the wafer via the solution. As a result, the wafer is electroplated with copper. As described above in conjunction with FIGS. 2, 3 and 6, the relatively large size of the additive molecules inhibits the plating rate of the upper surface of the wafer without significantly affecting the plating rate within the features. Thus, the features are advantageously filled with copper without voids.

The following exemplary solutions are summarized below to more clearly illustrate the present invention and the advantages thereof.

EXAMPLE 1

| | |
|---|---|
| metal | 18 g/l of Cu |
| acid | 170 g/l of $H_2SO_4$ |
| chloride ion | 0.03 g/l of HCl |
| additive | 0.015 g/l of poly(sodium styrene 4 sulfonate) |
| temperature | 22° C. |
| current density | 160 A/dm$^2$ |
| time | 4.5 min. |
| volume of solution | 8000 cm$^3$ |
| agitation | Yes |
| filtration | Yes |

EXAMPLE 2

| | |
|---|---|
| metal | 18 g/l of Cu |
| acid | 170 g/l of $H_2SO_4$ |
| chloride ion | 0.03 g/l of HCl |
| additive | 0.015 g/l of poly(sodium styrene 4 sulfonate) |
| | 8 ml/l Selrex CuBath M-HY 70/30 |
| temperature | 22° C. |
| current density | 160 A/dm$^2$ |
| time | 4.5 min. |
| volume of solution | 8000 cm$^3$ |
| agitation | Yes |
| filtration | Yes |

EXAMPLE 3

| | |
|---|---|
| metal | 18 g/l of Cu |
| acid | 170 g/l of $H_2SO_4$ |
| chloride ion | 0.03 g/l of HCl |
| additive | 0.005 g/l of poly(sodium styrene 4 sulfonate) |
| | 8 ml/l Selrex CuBath M-HY 70/30 |
| temperature | 22° C. |
| current density | 160 A/dm$^2$ |
| time | 4.5 min. |
| volume of solution | 8000 cm$^3$ |
| agitation | Yes |
| filtration | Yes |

In examples 2 and 3, a relatively large molecule additive is used in conjunction with a conventional additive having relatively small molecules to achieve desired metallurgical characteristics of the deposited copper. In these examples, the Selrex additive is used to optimize characteristics such as ductility and grain type (non-columnar). In particular, using the configuration of Example 3, in the test wafers no voids were observed in filling quarter-micron features having a four-to-one aspect ratio.

The embodiments of the electroplating system described above are illustrative of the principles of this invention and are not intended to limit the invention to the particular embodiments described. For example, other types of chemical solutions can be used for the bath, such as different acids, buffers, or metal compounds or combinations thereof. In addition, metals other than copper may be used in the bath for electroplating these other metals. In other embodiments, the cathode in the electroplating cell need not be an integrated circuit, but can be a printed circuit board, ceramic daughter board or other interconnect structure. In still other embodiments, the relatively large molecule additive can be used in combination with additives that are commercially available to achieve desired characteristics in the electrode-posited metal (e.g., grain size, grain orientation, brightness, plating rate). Accordingly, while the preferred embodiment of the invention has been illustrated and described, it is appreciated that in light of the present disclosure various changes can be made to the described embodiments without departing from the spirit and scope of the invention.

I claim:

1. A method of electroplating a metal onto a surface and in a feature in the surface, the feature having a width of less than one micron and a depth-to-width ratio of at least four-to-one, the method comprising:

providing a solution containing ions of the metal to be electroplated on the surface;

adding an additive to the solution; and providing an electric field, wherein the electric field causes ions of the metal in the solution to be deposited onto the surface and in the feature, wherein the additive consists essentially of molecules having a size at least equal to the width of the feature, the molecules of the additive inhibiting deposition of the metal onto portions of the surface that are accessible to the molecules, such that the deposition rate of the ions onto portions of the surface adjoining the feature is less than the deposition rate of the ions in the feature.

2. The method of claim 1 wherein the metal comprises copper.

3. The method of claim 1 wherein the feature has a width of less than 0.25 micron.

4. The method of claim 3 wherein the surface comprises a surface of an integrated circuit wafer.

5. The method of claim 4 wherein the feature is filled with the metal with substantially no voids.

6. The method of claim 1 wherein the additive has a molecular weight ranging from about 200,000 to 10,000,000.

7. The method of claim 1 wherein the additive has a concentration of about one part per million to about one part per thousand.

8. The method of claim 1 comprising adding a second additive to the solution, the second additive having molecules of a size that allows the molecules of the second additive to enter the feature.

9. The method of claim 1 wherein the feature comprises a hole having a bottom such that the hole is open only at the top.

10. The method of claim 1 wherein the additive is water soluble.

11. The method of claim 10 wherein the additive is acid stable.

12. The method of claim 1 wherein the additive is selected from the group consisting of polyacrylic acid, polystyrene, polyvinyl alcohol, polyvinylpyrrolidone, poly(methyl methacrylate), poly(dimethylsiloxane) and derivatives, polyacrylamide-co-acrylic acid, poly(2-hydroxyethl methacrylate), poly(methyl vinyl ether-alt-maleic anhydride), and poly(sodium 4-styrenesulfonate) and maleic acid copolymers.

13. The method of claim 12 wherein the additive is poly(sodium 4-styrenesulfonate).

14. A method of electroplating a metal onto a surface and in a feature, the feature having a width of from 0.05 micron to 0.5 micron and a depth-to-width ratio of from one-to-one to six-to-one, the method comprising:

providing a solution containing ions of the metal to be electroplated on the surface;

adding an additive to the solution; and providing an electric field, wherein the electric field causes ions of the metal in the solution to be deposited onto the surface and in the feature, wherein the additive consists essentially of molecules having a size at least equal to the width of the feature, the molecules of the additive inhibiting deposition of the metal onto portions of the surface that are accessible to the molecules, such that the deposition rate of the ions onto portions of the surface adjoining the feature is less than the deposition rate of the ions in the feature.

15. The method of claim 14 comprising adding a second additive to the solution, the second additive having molecules of a size that allows the molecules of the second additive to enter the feature.

* * * * *